United States Patent [19]

Othenin-Girard

[11] Patent Number: 4,460,281

[45] Date of Patent: Jul. 17, 1984

[54] MOUNTING ARRANGEMENT FOR PRINTED CIRCUITS IN ELECTRONIC WATCHES

[75] Inventor: André Othenin-Girard, Dombresson, Switzerland

[73] Assignee: Fabriques d'Horlogerie de Fontainemelon S.A., Fontainemelon, Switzerland

[21] Appl. No.: 352,974

[22] Filed: Feb. 26, 1982

[30] Foreign Application Priority Data

Feb. 26, 1981 [CH] Switzerland .................. 1318/81

[51] Int. Cl.³ .................. G04C 23/02; G04B 37/00
[52] U.S. Cl. .................. 368/88; 368/316
[58] Field of Search .................. 368/88, 316, 314, 155, 368/223, 76

[56] References Cited

U.S. PATENT DOCUMENTS

| | | | |
|---|---|---|---|
| 4,199,931 | 4/1980 | Yokoyama | 368/88 |
| 4,241,436 | 12/1980 | Bolzt et al. | 368/88 |
| 4,272,838 | 6/1981 | Kasama et al. | 368/88 |
| 4,274,630 | 6/1981 | Paratte | 368/88 |
| 4,296,488 | 10/1981 | Nakayama | 368/88 |
| 4,351,040 | 9/1982 | Aoki | 368/88 |

FOREIGN PATENT DOCUMENTS

| | | | |
|---|---|---|---|
| 7835219 | 7/1979 | France | |
| 1566695 | 5/1980 | United Kingdom | 368/88 |

Primary Examiner—Bernard Roskoski
Attorney, Agent, or Firm—Pollock, Vande Sande & Priddy

[57] ABSTRACT

The screws 8 which fix the printed circuit 1 to the plate 2 of the body of the movement extend through portions 4a of the copper layer 4 of the printed circuit located beneath openings 11 formed in the substrate 3 of the printed circuit. The portions 4a of the metallic layer 4 may be preformed into dished parts which engage in depressions 12 in the plate 2. As a result of this arrangement, the heads 8a of the screws 8 are recessed into the printed circuit board and countersunk into the thickness of the plate ', which avoids all risk of inadvertent contact with the negative pole of the battery 6 which supplies the movement or with the metal strip 7 in contact with this negative pole.

8 Claims, 3 Drawing Figures

MOUNTING ARRANGEMENT FOR PRINTED CIRCUITS IN ELECTRONIC WATCHES

BACKGROUND OF THE INVENTION

1. Technical Field

The present invention relates to an electronic timepiece and is concerned with the fixing of the printed circuit of this timepiece to the plate, or more generally the support, of the movement.

2. Background Art

The printed circuits of timepieces should preferably be removable for possible replacement. For this purpose, the printed circuits commonly are fixed to the support of the movement with the aid of screws which extend through the insulating substrate of the printed circuit on which metallic coatings are applied in order to form the conductive tracks. Consequently the head of the screw has an extra thickness compared with the printed circuit. Moreover, the screws being in general electrically conductive, there is a risk of the screwheads which project from the printed circuit producing particularly undesirable electrical connections between ground and the battery of the watch.

At present the trend is towards electronic watches which have a long battery life and a small thickness. The first result is obtained by using batteries of large diameter which thus occupy almost the entire surface of the movement. The reduction in thickness, in a conventional watch, can be obtained by increasing the density of the component parts within the movement, that is to say, by bringing the various component parts and particularly the non-moving parts as closely together as possible. Consequently, in a watch which combines these two characteristics, the whole of the surface of the printed circuit and one of the faces of the battery may be located in close proximity to each other. The extra thickness due to the heads of the screws may give rise to short circuits.

More generally, the heads of screws projecting from the printed circuit result in an increase in thickness which it would be desirable to eliminate or, at least, reduce. However, it is necessary that the fixing of the printed circuit should be capable of withstanding the shocks to which a watch may be subjected in the course of its life.

One known solution of this problem consists in machining a counter-sink for the screw-head which occupies only a portion of the thickness of the insulating substrate. Thus, a part of the screw-head is countersunk into the substrate. The disadvantage of such a solution consists in the fact that the reduction in thickness corresponds to only a fraction of the thickness of the insulating substrate and that the machining of this countersink is a very delicate operation.

SUMMARY OF THE INVENTION

Consequently, the invention has for its object to provide an electronic timepiece in which the heads of the screws for the fixing of the printed circuit are countersunk more substantially, while at the same time a good fixing of the printed circuit to the support of the movement is ensured. Furthermore, this fixing should not involve any complicated procedure either in the production of the printed circuit or in the fitting thereof in the movement of the watch.

This object is attained by the invention, which provides an electronic timepiece comprising a movement support, a printed circuit comprising an insulating substrate and a conductive layer having a plurality of regions devoid of insulating substrate and means for fixing the printed circuit on the support, the fixing means comprising a plurality of headed fixing members, extending through holes formed in the regions of the conductive layer which are devoid of substrate and being screwed into the support so as to grip the conductive layer between the heads of the fixing members and the support.

It is thus clear that the head of each fixing member is at least partly countersunk into the thickness of the insulating substrate. The reduction in thickness is equal to the thickness of the insulating substrate which may be thicker than the heads.

In an improved form of construction, the surface of the support has depressions around the holes into which the fixing members are screwed, in which the heads of the latter are countersunk, the said regions of the conductive layer being dished into the depressions. Thus, the whole of the thickness of the head of the screw is countersunk into the thickness of the depression and of the insulating substrate.

BRIEF DESCRIPTION OF THE DRAWINGS

The drawing shows by way of example three embodiments of the invention.

DETAILED DESCRIPTION OF THE PREFERRED EMBODIMENT

Figure 1:
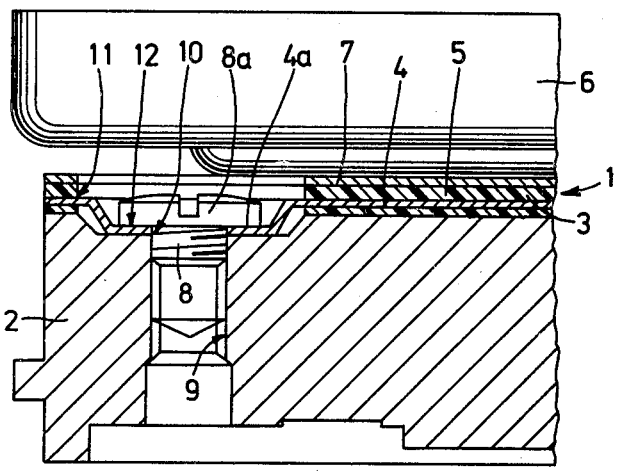
FIGS. 1 to 3 are partial axial sections of three embodiments respectively of timepiece movements.

In the embodiment of FIG. 1, the printed circuit 1 lies on a support plate 2 of the movement. This printed circuit comprises a substrate 3 made of a plastics material, for example KAPTON (Registered Trade Mark), which is a polyamide, coated with a layer 4 of copper in which are formed the conductive tracks of the circuit. This circuit is applied to the plate 2 with the interposition of a layer 5 of insulating material. The battery 6 has a metal strip 7 in contact with the negative pole of the cell.

The printed circuit 1 is fixed to the plate 2 by several fixing members which, in the example considered, are screws 8, only one of which is visible in the drawing, engaged in holes 9 in the plate. These screws extend through holes 10 provided in the metallic layer 4 of the circuit 1. These holes 10 are formed in depressed portion 4a of the layer 4 which extend over openings 11 formed in the substrate 3 of the printed circuit. The plate 2 has depressed portions 12 located in the regions of the holes 9 which receive the screws. The depressed portions 4a of the metallic layer 4, which extend over the openings 11 in the substrate 3, are preformed so that they constitute dished parts which engage in the depressed portions 12 in the plate 2.

As a result of this arrangement, the heads 8a of the screws 8 are countersunk into the thickness of the plate 2, being engaged in the depressed portions 4a of the metallic layer 4, which portions are in turn lodged in the depressed portions 12. As a result, there is no risk of the heads 8a coming into contact with the metal strip 7 or even into direct contact with the negative pole of the battery 6. In addition, this arrangement grounds the metallic coating 4 of the printed circuit.

Figure 2:
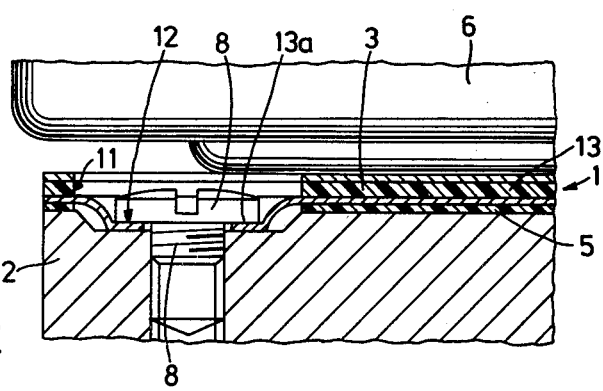

The embodiment of FIG. 2, in which the elements that are the same as those of FIG. 1 have been indicated by the same reference numerals. In this second embodiment, those portions 13a of the copper layer 13 are initially flat which are located beneath the openings 11 in the substrate 3 of the printed circuit. It is the pressure exerted by the heads 8a of the screws 8 on these portions 13a of the layer 13 which produces the deformation thereof, causing them to become engaged in the depressed portions 12 in the plate 2.

Figure 3:
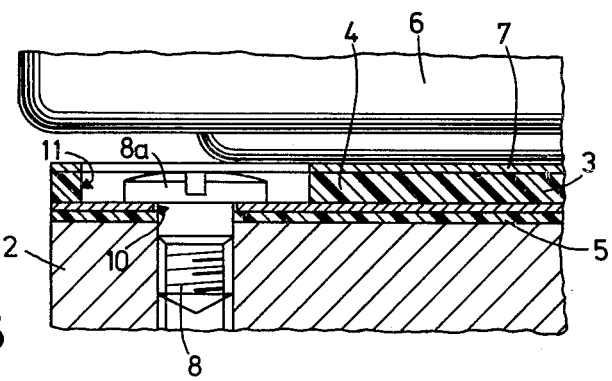

FIG. 3 illustrates a third, more simple embodiment. It differs from the embodiments of FIGS. 1 and 2 only in that the plate 2 does not have the depressed portion 12 at the fixing points. This solution is satisfactory particularly when the head 8a of the screw has a thickness which is less than that of the insulating substrate 3 of the printed circuit 1. In any case, this technique makes it possible to gain, in thickness, the thickness of the insulating substrate.

Alternatively, the parts of the metallic coating of the printed circuit which are clamped by the fixing screws, could project from the circuit at its periphery, instead of being located beneath openings formed in the printed circuit.

It would thus appear that the mechanical connection between the plate and the printed circuit is obtained solely by the cooperation between the metallic layer and the head of the screw. Although the metallic layer, which is for example of copper, has only a very small thickness, for example 35 μm, the force needed to tear the printed circuit away from the substrate is very much greater than the force to which the printed circuit is normally subjected, such forces being for example of the order of 10N.

In addition, since the depressed portions are formed in regions of the printed circuit where there is only the metallic layer, no problem arises of the metallic layer becoming unstuck from the substrate during the formation of the dished part.

Finally, the man skilled in the art will appreciate that the local elimination of the insulating substrate over certain parts of the metallic layer does not pose any special problem since this technique is already used for producing electrical connections between the terminals of an integrated circuit and the conductive tracks of the printed circuit. In particular, according to the technique used at the present time by the applicants, the printed circuit is produced, starting from a sheet of insulating material and sticking on one surface of this sheet metal coatings corresponding to the tracks to be produced. According to such a method, it is sufficient to form openings in the insulating substrate before sticking on the metal coatings.

Various other modifications of the present invention will be apparent to those skilled in the art, and it therefore is intended that the scope of the present invention is limited solely by the scope of the appended claims.

I claim:

1. An electronic timepiece, comprising:

a movement support;

a printed circuit including an insulating substrate and a conductive layer having a plurality of regions devoid of insulating substrate, each of said regions being provided with a hole; and means for fixing said printed circuit on said support, said means comprising a plurality of fixing members having heads smaller in diameter than said regions of said conductive layer, said heads engaging said regions of said conductive layer and being spaced from said insulating substrate adjacent said regions, said fixing members extending through said holes formed in said regions, and said fixing members being screwed into said support for gripping said regions of said conductive layer between said heads of said fixing members and said support without gripping said insulating substrate.

2. A timepiece according to claim 1, wherein said substrate of said printed circuit has a thickness greater than that of the said heads.

3. A timepiece according to claim 1, wherein said support has depressed portions around the holes into which said fixing members are screwed, said heads being countersunk in said depressed portion, said regions of said conductive layer being dished into said depressed portion.

4. A timepiece according to claim 3, wherein said regions of said conductive layer are further provided with pre-formed dished parts corresponding to said depressions of said support, each dished part being provided with one of said holes.

5. A timepiece according to claim 3, wherein said regions of said conductive layer are further provided with dished parts corresponding to said depressions of said support, each dished part being provided with one of said holes and having a shape resulting from the deformation of said conductive layer due to the cooperation of the head of a fixing member with a depression of said support.

6. A timepiece according to claim 3, in which said regions of said conductive layer comprise portions of said conductive layer disposed across openings in said insulating substrate.

7. A timepiece according to claim 6, wherein said regions of said conductive layer are further provided with pre-formed dished parts corresponding to said depressions of said support, each dished part being provided with one of said holes.

8. A timepiece according to claim 6, wherein said regions of said conductive layer are further provided with dished parts corresponding to said depressions of said support, each dished part being provided with one of said holes and having a shape resulting from the deformation of said conductive layer due to the cooperation of the head of a fixing member with a depression of said support.

* * * * *